(12) United States Patent
Mühsam et al.

(10) Patent No.: US 10,324,886 B2
(45) Date of Patent: Jun. 18, 2019

(54) HOLDING DEVICE, ASSEMBLY HAVING A HOLDING DEVICE AND RACK SERVER SLOT

(71) Applicant: FUJITSU LIMITED, Kawasaki-shi, Kanagawa (JP)

(72) Inventors: Gerhard Mühsam, Königsbrunn (DE); Reinhard Salmen, Lichtenau (DE)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/593,397

(22) Filed: May 12, 2017

(65) Prior Publication Data

US 2017/0249275 A1 Aug. 31, 2017

Related U.S. Application Data

(63) Continuation of application No. PCT/EP2016/051355, filed on Jan. 22, 2016.

(30) Foreign Application Priority Data

Jan. 29, 2015 (DE) .................. 10 2015 101 308

(51) Int. Cl.
| | |
|---|---|
| *G06F 15/00* | (2006.01) |
| *G06F 13/40* | (2006.01) |
| *G06F 1/18* | (2006.01) |
| *H05K 7/14* | (2006.01) |
| *G06F 13/42* | (2006.01) |

(52) U.S. Cl.
CPC .......... *G06F 13/4081* (2013.01); *G06F 1/185* (2013.01); *G06F 13/4282* (2013.01); *H05K 7/1487* (2013.01)

(58) Field of Classification Search
None
See application file for complete search history.

(56) References Cited

U.S. PATENT DOCUMENTS

| | | | | |
|---|---|---|---|---|
| 6,657,867 B2 * | 12/2003 | Smith | ............ | G06F 1/181 312/223.2 |
| 6,674,652 B2 * | 1/2004 | Forte | ............ | H05K 5/0269 174/363 |
| 6,731,515 B2 * | 5/2004 | Rhoads | ............ | H05K 1/14 361/785 |

(Continued)

FOREIGN PATENT DOCUMENTS

| | | |
|---|---|---|
| DE | 102008034704 | 12/2009 |
| DE | 102008061031 | 6/2010 |
| DE | 102013101842 | 4/2014 |

*Primary Examiner* — Cheng Yuan Tseng
(74) *Attorney, Agent, or Firm* — Fujitsu Patent Center

(57) ABSTRACT

The invention relates to a holding device for securing at least one first expansion card in a rack server slot of one height unit. Incidentally, the holding device comprises a base body and a first holding tab, which is arranged on a first side of the base body. The first holding tab is configured to secure a riser card and a module to the holding device. Furthermore, the holding device comprises at least one second holding tab located on a second side of the base body opposite the first side. The at least one second holding tab is configured to secure a first expansion card to the holding device. Furthermore, the invention relates to an assembly having a holding device and a rack server slot of one height unit.

14 Claims, 5 Drawing Sheets

(56) References Cited

U.S. PATENT DOCUMENTS

Figure 1:
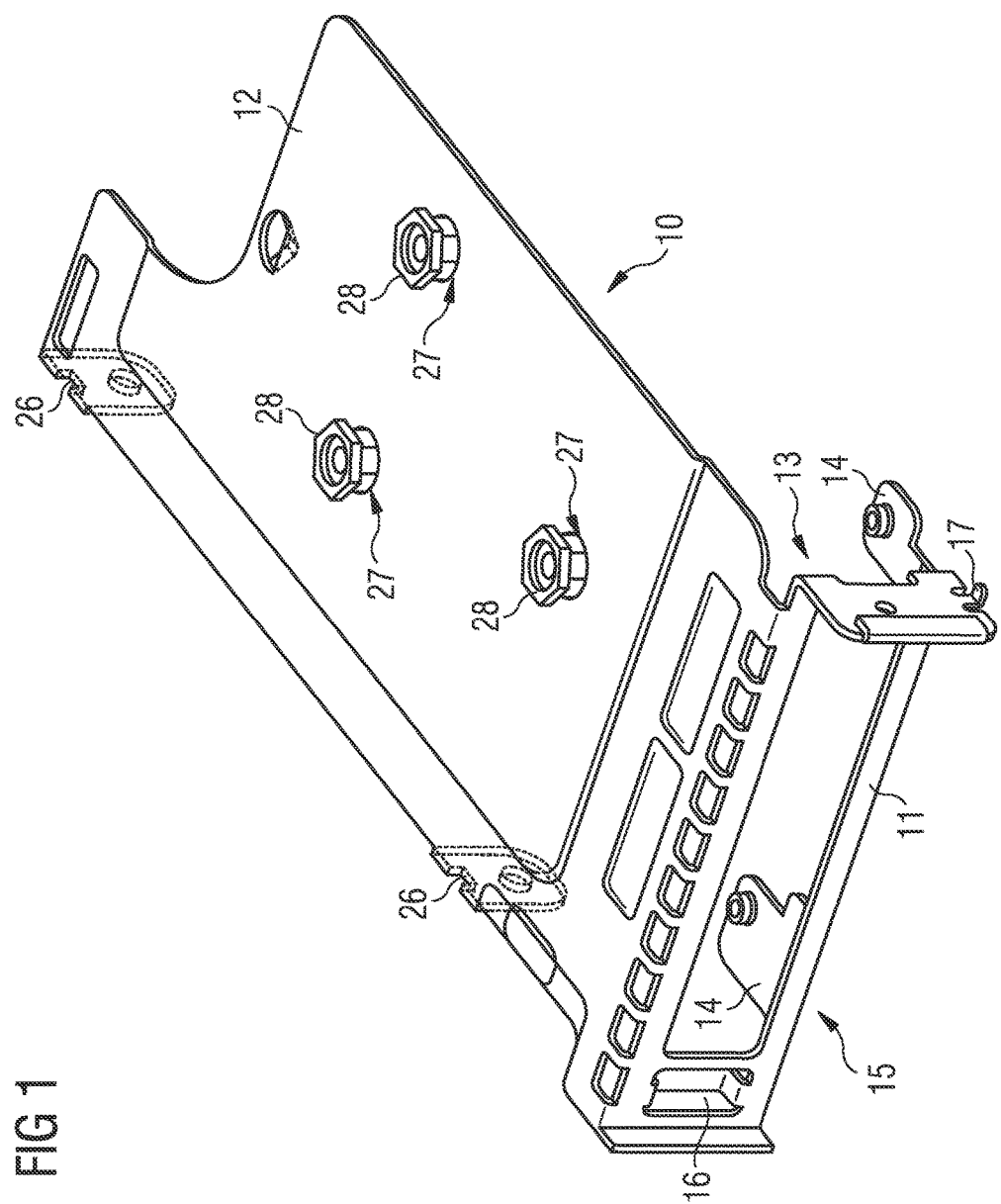

| | | | |
|---|---|---|---|
| 6,735,092 B2* | 5/2004 | Fujii | H01R 13/112 |
| | | | 361/720 |
| 6,816,388 B2* | 11/2004 | Junkins | H05K 7/1418 |
| | | | 361/727 |
| 7,122,747 B1 | 10/2006 | Wang et al. | |
| 7,433,983 B2* | 10/2008 | Lu | G06F 9/4411 |
| | | | 710/104 |
| 7,525,815 B2* | 4/2009 | Chen | G06F 1/185 |
| | | | 361/755 |
| 8,054,642 B2* | 11/2011 | Liu | G06F 1/185 |
| | | | 361/759 |
| 9,086,857 B2* | 7/2015 | Fu | G06F 1/186 |
| 2011/0075358 A1 | 3/2011 | Fietz et al. | |
| 2011/0128710 A1 | 6/2011 | Kuo et al. | |
| 2011/0292590 A1 | 12/2011 | Fietz et al. | |
| 2012/0147576 A1 | 6/2012 | Chiu et al. | |
| 2013/0088831 A1 | 4/2013 | Zheng et al. | |
| 2013/0107441 A1 | 5/2013 | Zhou | |
| 2013/0335911 A1 | 12/2013 | Pang et al. | |
| 2015/0009617 A1 | 1/2015 | Yin et al. | |

* cited by examiner

HOLDING DEVICE, ASSEMBLY HAVING A HOLDING DEVICE AND RACK SERVER SLOT

The invention relates to a holding device, an assembly having a holding device and a rack server slot of one unit.

Rack server slots are manufactured in predetermined height units so that various rack server slots of one unit or two units, for example, can be offered in a standardized fashion. Thus, a rack server slot of one height unit has to fulfil this standard. However, this results in the construction space inside a rack server slot being strongly limited. This can particularly be seen when mounting various components, the size of which was designed for other computer systems.

The object of the invention is to provide a holding device, an assembly as well as a rack server slot, which allow installation components to be advantageously arranged in a rack server slot.

According to a first aspect of the invention, the object is achieved by a holding device. The holding device serves for securing at least a first expansion card in a rack server slot of one height unit. Incidentally, the holding device comprises a base body and a first holding tab, which is arranged on a first side of the base body and configured to secure a riser card and a module on the holding device. Furthermore, the holding device comprises at least a second holding tab on a second side of the base body opposite the first side, which is configured to secure a first expansion card on the holding device.

The holding device is designed for a rack server system of one height unit, so that the holding device can be mounted in such a rack server system. A module and a riser card can be mounted on the first holding tab. In addition, a first expansion card can be mounted on the second holding tab and thus be accommodated in the rack server system via the holding device. In this way, installation of an additional component in the rack server system is made possible, which would otherwise not fit into the rack server system.

According to an advantageous embodiment, the base body is formed in the shape of a frame. The base body is configured to receive a mounting bracket of a second expansion card. The base body comprises a slot tab and a protrusion. The mounting bracket can be inserted in the slot tab and be placed onto the protrusion. Thus, the second expansion card can be secured to the frame-shaped base body instead of the module.

The holding device, thus, may receive an additional, second expansion card instead of the module. In this way, two expansion cards can be accommodated one above the other in one rack server slot of one (height) unit.

According to another advantageous embodiment, the holding device comprises two second holding tabs each having a fastening device for the first expansion card. The fastening devices are spaced from one another in accordance with a standard of the first expansion card.

The first expansion card is stably secured to the holding device by a second holding tab. Thus, the holding device as a whole, in particular the base body, is additionally stabilized via the rigidity of the first expansion card.

According to another advantageous embodiment, the holding device is formed integrally.

An integral design is advantageous for the mounting process, since working steps can be omitted. The holding device is formed of a metal part such as sheet metal by means of punching or bending, for example. Just as well, the holding device can be manufactured from a plastic material as an injection molded part.

According to another advantageous embodiment, the standard of the first expansion card and/or a standard of the second expansion card is a PCIe standard.

PCIe cards have large dimensions and standardized plugs. These plugs are used for electrically contacting the PCIe cards. In addition, the PCIe cards are fixed to the riser card by the plugs. The PCIe cards can be secured to the holding device via standardized bores.

According to a second aspect of the invention, the object is achieved by an assembly having a holding device according to the first aspect. The assembly further comprises a riser card having a first port or having a first and a second port for expansion cards, which are secured to the first holding tab. Furthermore, the assembly comprises a first expansion card, which is secured to the at least one second holding tab and operatively plugged into the first port of the riser card. In addition, a module is secured to the first holding tab.

Accommodating a single PCIe card in a rack server slot in one height unit is a challenge already. To that end, there are riser cards that put a port for these PCIe components in a horizontal plane so that the large expansion cards can be mounted in the rack server slot horizontally. However, almost the entire height of the rack server slot is used as a result. By arranging the expansion card via the holding device according to the first aspect, a module can additionally be mounted in the rack server slot.

According to an advantageous embodiment, the module comprises an electric energy storage.

In the case of a power failure, e.g. the first expansion card or as well further components can still be supplied with energy by the electric energy storage. In this way, the rack server system can be shut down in a well-controlled manner in order to prevent data loss. The module is a battery, a battery pack or a capacitor, for example.

According to a third aspect of the invention, the object is achieved by an assembly having the holding device according to the first aspect. Incidentally, the assembly comprises a riser card having a first port and a second port for expansion cards, which is secured to the first holding tab. The assembly comprises an electrically insulating film, which is arranged between the first port and the second port. Furthermore, the assembly comprises a first expansion card, which is secured to the at least one second holding tab and operatively plugged into the first port of the riser card. Furthermore, a second expansion card is secured to the holding device via a mounting bracket and operatively plugged into the second port of the riser card.

Securing two expansion cards to one holding device that can be inserted in a rack server system of one (height) unit is enabled by the electrically-insulating film, whereby the distance between the two expansion cards can be minimized. As a result, it is excluded that the first expansion card causes a short-circuit in the second expansion card or vice versa.

According to an advantageous embodiment, the first port and the second port are arranged offset to one another on the riser card.

Incidentally, the two ports on the riser card are arranged in such a way that the distance between the base body of the holding device and the two ports is of a different size. Now, if expansion cards of the same standard, e.g. the PCIe standard, are plugged in the ports, the components are offset on the PCIe card and additional space is obtained, which can be used for construction heights of the PCIe cards. In particular, a port contact bar of the second expansion card is not bent or displaced by components of the first expansion card of the circuit board of the first expansion card, so that the port contact bar of the second expansion card rests on a certain position on the base body. In this case, no port contact bar is provided on the first expansion card.

According to an advantageous embodiment, the electrically insulating film has an angular U-shaped region. A first surface for insulating the first expansion card and a second surface protrude from a base surface of the angular U-shaped region. Incidentally, the width of the base surface corresponds to a distance of the first port to the second port of the riser card. The second surface can be latched with a protrusion of one of the two ports of the riser card.

Due to this construction of the insulating film, the insulating film can be plugged onto the riser card and is retained by the two ports. In addition, the insulating card rests against the at least one second holding tab, for example.

According to a fourth aspect of the invention, the object is achieved by a rack server slot of one height unit having an assembly of the above kind.

By the arrangement in the rack server slot, accommodation of multiple components in a kind of sandwich-like structure is realized in a rack server system of merely one (height) unit.

According to an advantageous embodiment, a main board having a plug-in slot for a riser card is arranged in the rack server slot. The main board comprises a recess next to the plug-in slot. Incidentally, the riser card of the assembly is plugged into the plug-in slot, so that the first expansion card is arranged in the region of the recess.

The entire space between a bottom part of the chassis of the rack server slot and a cover part of the rack server slot can be used for the assembly. The construction height of the main board and the fastening process thereof in the chassis is additionally available.

Figure 2:
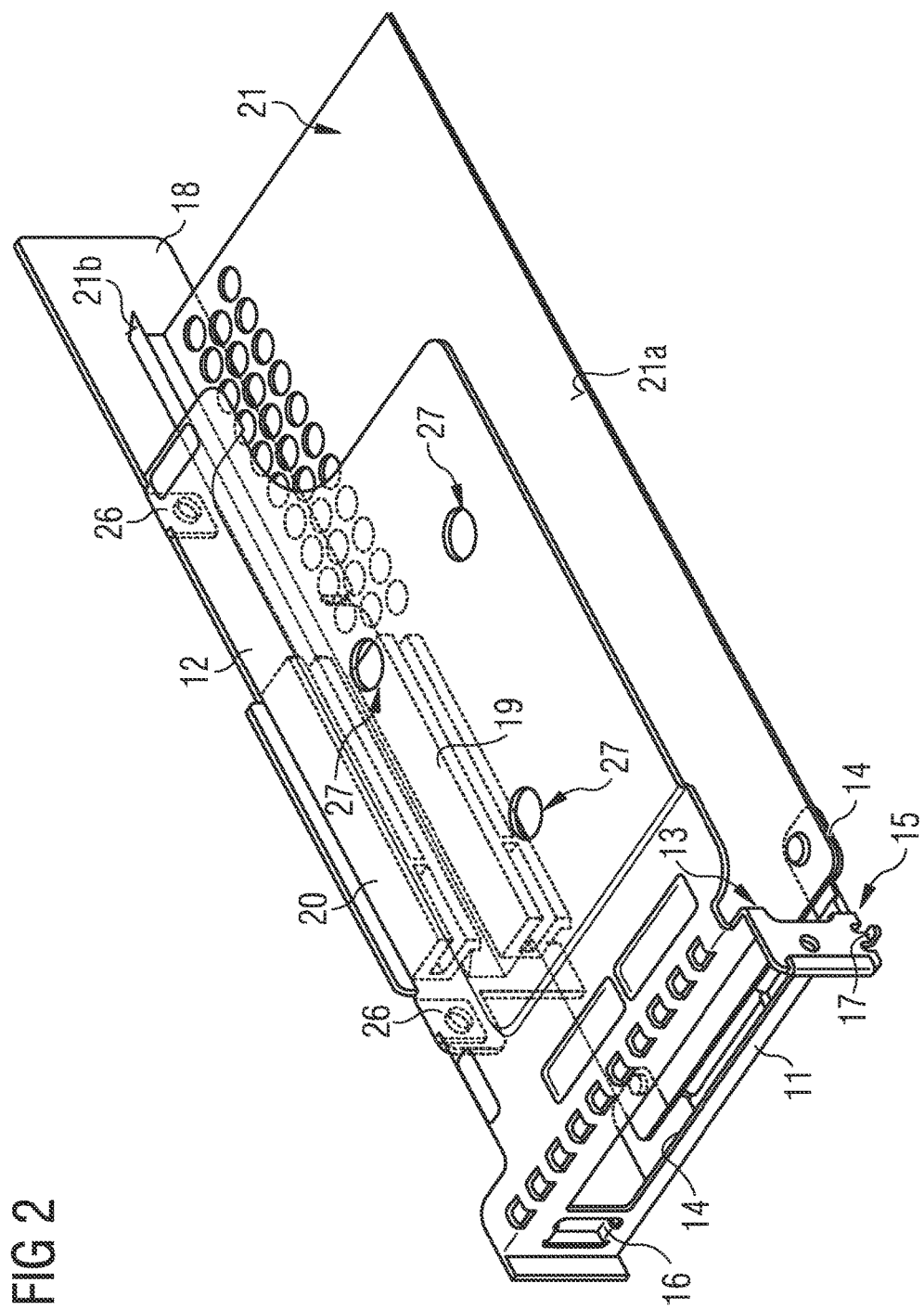
Figure 3:
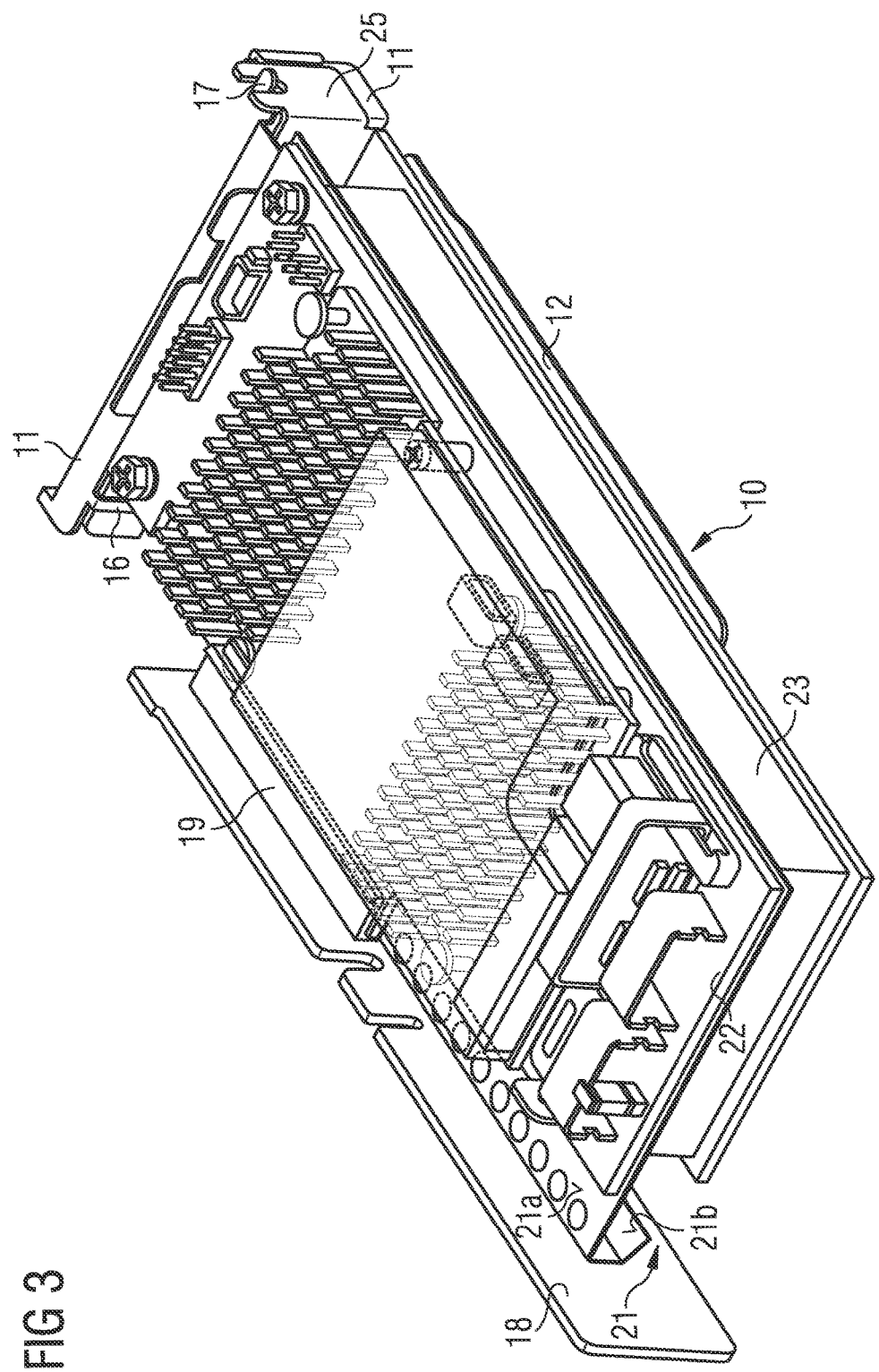
Figure 4:
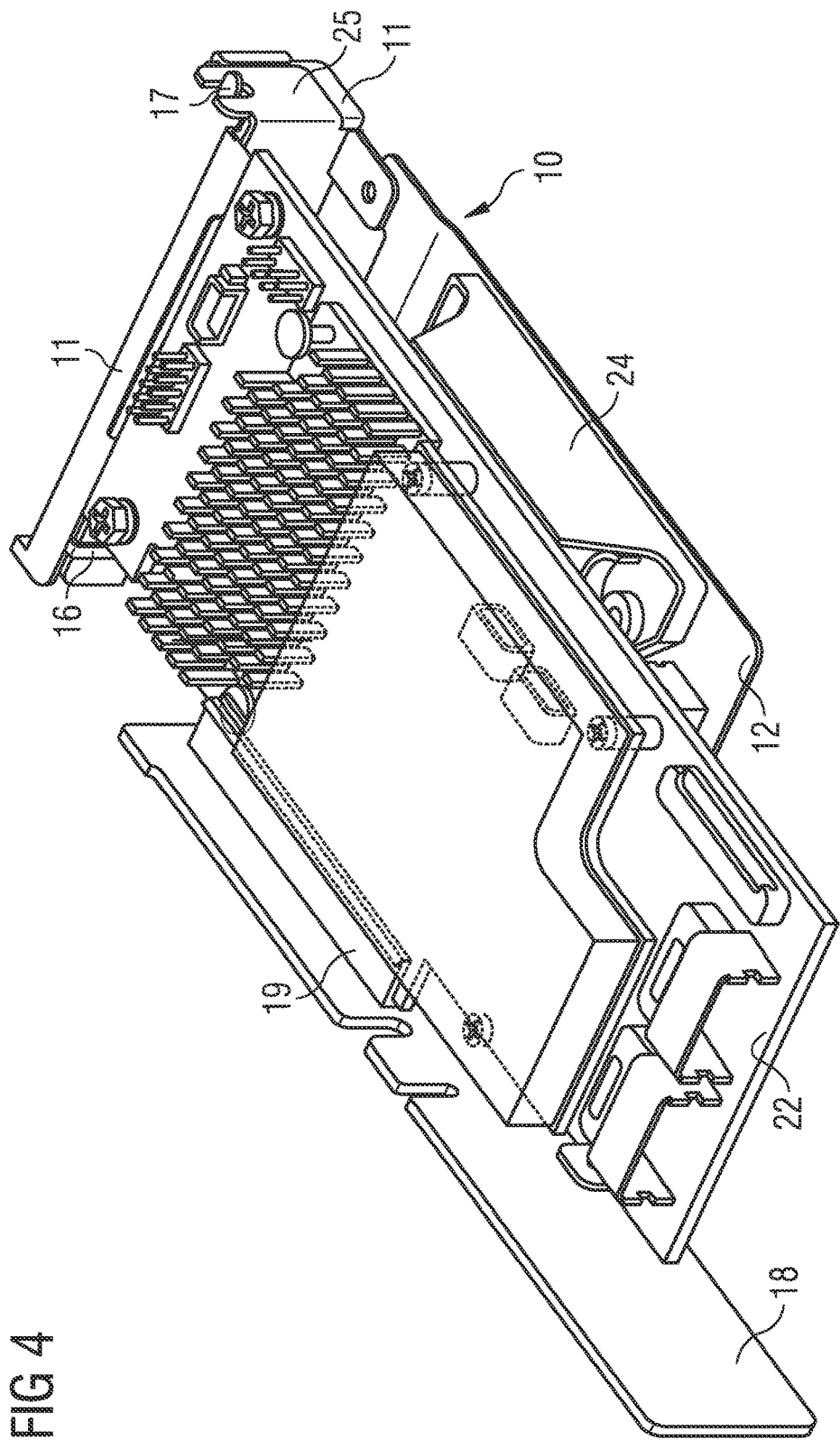
Figure 5:
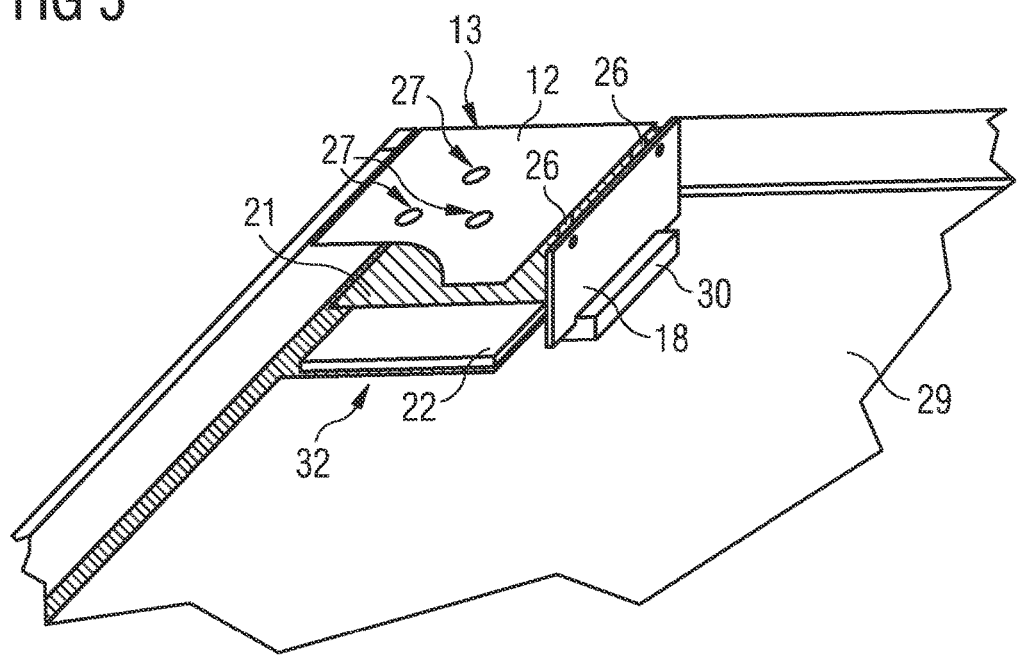

The invention will hereinafter be described in greater detail by means of exemplary embodiments and figures. The figures show in:

FIG. 1 a holding device according to one embodiment of the invention,

FIG. 2 a part of an assembly according to an embodiment of the invention,

FIG. 3 a schematic illustration of an assembly according to an exemplary embodiment of the invention, FIG. 4 another schematic illustration of an embodiment of the invention, and FIG. 5 a schematic illustration of a part of a rack server slot having a holding device according to one embodiment of the invention.

FIGS. 1 to 5 each show a holding device 10 in different arrangements. Like features are indicated with like reference numerals in FIGS. 1 to 5. However, this shall not pose any limitation for the present invention.

FIG. 1 shows a holding device 10. In the exemplary embodiment, the holding device 10 is a holding clamp formed of an integral metal sheet. In other embodiments, the holding device 10 is made from a plastic material by means of injection molding, for example. Just as well, the holding device 10 can also be formed in multiple parts. The holding device 10 comprise a base body 11. The base body 11 is configured in the shape of a frame, so that elements arranged behind the base body 11 can be accessed through the opening of the frame.

A first holding tab 12 is arranged on the base body 11. In this case, the first holding tab 12 is arranged at a first side 13 of the base body 11 and bent away from the rectangular frame of the base body 11 at a right angle. The width of the first holding tab 12 essentially corresponds to the width of the base body 11.

In addition to the first holding tab 12, two second holding tabs 14 are arranged on the base body 11. However, in other configurations, the two holding tabs 14 can be combined in a single holding tab 14. The two holding tabs 14 are arranged at a second side 15 of the base body 11 and are thus located opposite the first side 13 from the recess of the frame-shaped base body 11.

A riser card 18 can be secured to the first holding tab 12 via fastening tabs 26. Furthermore, the first holding tab 12 comprises a fastening device 27. In the exemplary embodiment, the fastening device 27 consists of three holes formed in the first holding tab 12. In the arrangement according to FIG. 1, fastening elements 28 are formed in the fastening device 27, in order to receive a module 24. The fastening elements 28 are plugged into the fastening device 27 and have a mushroom-shaped feature, into which the module 24 can be clicked.

In FIG. 2, the riser card 18 is secured to the first holding tab 12 with fastening tabs 26. The riser card 18 comprises a first port 19 and a second port 20. In the exemplary embodiment, the first port 19 and the second port 20 are PCIe ports, with the PCIe expansion cards being pluggable therein. Incidentally, the riser card 18 protrudes from the first holding tab 12 in the direction of the second holding tabs 14. The first port 19 and the second port 20 are thus located between the first holding tab 12 and the second holding tab 14. The holding tab 12 covers the two ports 19, 20 and thus represents a protection for the first port 10 and the second port 20, as well as for the expansion cards 22, 23 plugged into the two ports 19, 20.

In FIGS. 2 and 3 additionally illustrate an insulating film 21. The insulating film 21 has an angular U-shaped region. A first surface 21a and a second surface 21b protrude from a base surface of the U-shaped region. The first surface 21a protrudes to an extent that a first expansion card 22 (e.g. a cougar controller) plugged into the first port 19 is completely insulated from a second expansion card 23 plugged into the second port 20. The components of one expansion card 22, 23 are protected from the soldering spots and individual components of the respective other expansion card 23, 22, by the insulating film 21, so that a shirt-circuit is prevented. As a result, the distance between the expansion cards 22, 23 can be selected to be very small. This distance can be below a specified minimum distance for protection against short-circuits.

FIG. 3 shows an arrangement of the holding device 10 with an exemplary equipment. The frame-shaped base body comprises a slot tab 16. Furthermore, the frame-shaped base body comprises a protrusion 17. The slot tab 16 and the protrusion 17 serve for receiving a mounting bracket 25. The first expansion card 22 is fixed to the second holding tabs 14 by means of screw-connections. Furthermore, the second expansion card 23 is fixed to the base body 11 via the mounting bracket 25. To that end, the mounting bracket 25 in inserted in the slot tab 16 and rests against the protrusion 17 with a recess.

In FIG. 3 shows the second expansion card 23 is as a volume body without contour. In further configurations, the second expansion card 23 may of course include customary PCIe cards.

The insulating film 21 is arranged between the first expansion card 22 and the second expansion card 23, which electrically insulates the first expansion card 22 from the second expansion card 23. The two expansion cards 22, 23 are plugged into the two ports 19, 20 of the riser card 18 and are thus operatively connected with the riser card.

When the assembly is plugged into a plug-in slot 30 with a plug contact of the riser card 18 on the main board 29 in a rack server slot 31, both the first expansion card 22 and the second expansion card 23 can be addressed via this electric connection.

Furthermore, connection contacts (not illustrated) of the port contact bar of the second expansion card 23 can be contacted through the opening of the frame-shaped base body 11.

FIG. 4 shows an illustration of an assembly according to another exemplary embodiment. The first expansion card 22 is mounted on the base body 11 via the second holding tabs 14, in analogy to the assembly according to FIG. 3. The first expansion card 22 is plugged into the first port 19 of the riser card 18 in this embodiment as well. The mounting bracket 25 is configured as a face plate and closes the opening of the frame-shaped base body 11. Incidentally, a second expansion card 23 is not secured with the mounting bracket 25.

A module 24 is fixed to the first holding tab 12 instead of the second expansion card 23. In the exemplary embodiment, the module 24 is a battery packet, which serves for protection of certain components of the rack server in case of a power failure. Thus, the battery packet can supply a voltage for the first expansion card 22. The module 24 is latched with the fastening elements 28 and thereby secured to the fastening device 27. To that end, the module comprises elongated holes, which have different radii on opposite ends, so that the mushroom-shaped fastening elements 28 can be plugged in at one side of the holes of the module 24 and the module 24 can be clamped therein by displacing the module 24.

FIG. 5 shows a schematic illustration of a rack server slot 31 having the main board 29 as well as the holding device 10. The holding device 10 is inserted at one side of the rack server slot 31 in a form-fit manner here. Incidentally, the riser card 18 engages the plug-in slot 30 on the main board 29. The main board 29 comprises a recess 32, which is located in the region of the holding device 10. The expansion card 22 is located close to the bottom plate of the chassis of the rack server slot 31. Due to the fact that the recess 32 of the main board 20 is arranged in this region, additional space is obtained, so that there is sufficient space between the first expansion card 22 and a cover of the rack server slot 31 in for installing the second expansion card 23 or the module 24.

LIST OF REFERENCE NUMERALS 10 holding device
11 base body
12 first holding tab
13 first side
14 second holding tab
15 second side
16 slot tab
17 protrusion
18 riser card
19 first port
20 second port
21 insulating film
21a, 21b surface
22 first expansion card
23 second expansion card
24 module
25 mounting bracket
26 fastening tab
27 fastening device
28 fastening element
29 main board
30 plug-in slot
31 rack server slot
32 recess

The invention claimed is:

1. Holding device for securing at least one first expansion card in a rack server system of one height unit, comprising:
   a base body;
   a first holding tab, which is arranged on a first side of the base body and which is configured to secure a riser card and a module to the holding device; and
   at least one second holding tab located on a second side of the base body opposite the first side and configured to secure a first expansion card to the holding device,
   wherein the holding device is formed of one single part,
   wherein an electrically insulating film is arranged at the holding device, the electrically insulating film comprising an angular U-shaped region, wherein a first surface for insulating the first expansion card and a second surface protrude from a base surface of the U-shaped region.

2. Holding device according to claim 1,
   wherein the base body is configured in the shape of a frame and configured to receive a mounting bracket of a second expansion card, wherein the base body comprises a slot tab and a protrusion, and wherein the mounting bracket can be inserted in the slot tab and be placed onto the protrusion and thus the second expansion card can be secured to the frame-shaped base body instead of the module.

3. Holding device according to claim 1, wherein the holding device comprises two second holding tabs each having a fastening device for the first expansion card, wherein the fastening devices are spaced from one another in accordance with a standard of the first expansion card.

4. Holding device according to claim 1, wherein the standard of the first expansion card is a PCIe standard.

5. Holding device according to claim 2, wherein the standard of the second expansion card is a PCIe standard.

6. Assembly comprising:
   a holding device for securing at least one first expansion card in a rack server system of one height unit, the holding device comprising a base body, a first holding tab, which is arranged on a first side of the base body and which is configured to secure a riser card and a module to the holding device, and at least one second holding tab located on a second side of the base body opposite the first side and configured to secure a first expansion card to the holding device, wherein the holding device is formed of one single part;
   a riser card having a first port or having a first port and a second port for expansion cards, which is secured to the first holding tab;
   a first expansion card, which is secured to the at least one second holding tab and operatively plugged into the first port of the riser card;
   a module, which is secured to the first holding tab; and
   an electrically insulating film,
   wherein the electrically insulating film comprises an angular U-shaped region, wherein a first surface for insulating the first expansion card and a second surface protrude from a base surface of the U-shaped region.

7. Assembly according to claim 6,
   wherein the first port and the second port are arranged offset to one another on the riser card.

8. Assembly according to claim 7,
wherein the module comprises an electric energy storage.

9. Assembly comprising:
- a holding device for securing at least one first expansion card in a rack server system of one height unit, the holding device comprising a base body, a first holding tab, which is arranged on a first side of the base body and which is configured to secure a riser card and a module to the holding device, and at least one second holding tab located on a second side of the base body opposite the first side and configured to secure a first expansion card to the holding device, wherein the holding device is formed of one single part;
- a riser card having a first port and a second port for expansion cards, which is secured to the first holding tab;
- an electrically insulating film, which is arranged between the first port and the second port;
- a first expansion card, which is secured to the at least one second holding tab and operatively plugged into the first port of the riser card; and
- a second expansion card, which is secured to the holding device by means of a mounting bracket and which is operatively plugged into the second port of the riser card,
- wherein the electrically insulating film comprises an angular U-shaped region, wherein a first surface for insulating the first expansion card and a second surface protrude from a base surface of the U-shaped region, and wherein the width of the base surface corresponds to a distance of the first port to the second port of the riser card and wherein the second surface can be latched with a protrusion of one of the two ports of the riser card.

10. Assembly according to claim 9,
wherein the first port and the second port are arranged offset to one another on the riser card.

11. Rack server system of one height unit comprising an assembly with:
- a holding device for securing at least one first expansion card in a rack server system of one height unit, the holding device comprising a base body, a first holding tab, which is arranged on a first side of the base body and which is configured to secure a riser card and a module to the holding device, and at least one second holding tab located on a second side of the base body opposite the first side and configured to secure a first expansion card to the holding device, wherein the holding device is formed of one single part;
- a riser card having a first port or having a first port and a second port for expansion cards, which is secured to the first holding tab;
- a first expansion card, which is secured to the at least one second holding tab and operatively plugged into the first port of the riser card;
- a module, which is secured to the first holding tab; and
- an electrically insulating film,
- wherein the electrically insulating film comprises an angular U-shaped region, wherein a first surface for insulating the first expansion card and a second surface protrude from a base surface of the U-shaped region.

12. Rack server system according to claim 11,
wherein a main board with a plug-in slot for a riser card is arranged in the rack server system which comprises a recess next to the plug-in slot, and wherein the riser card of the assembly is plugged into the plug-in slot, so that the first expansion card is arranged in the region of the recess.

13. Rack server system of one height unit comprising an assembly with:
- a holding device for securing at least one first expansion card in a rack server system of one height unit, the holding device comprising a base body, a first holding tab, which is arranged on a first side of the base body and which is configured to secure a riser card and a module to the holding device, and at least one second holding tab located on a second side of the base body opposite the first side and configured to secure a first expansion card to the holding device, wherein the holding device is formed of one single part;
- a riser card having a first port and a second port for expansion cards, which is secured to the first holding tab;
- an electrically insulating film, which is arranged between the first port and the second port;
- a first expansion card, which is secured to the at least one second holding tab and operatively plugged into the first port of the riser card; and
- a second expansion card, which is secured to the holding device by means of a mounting bracket and which is operatively plugged into the second port of the riser card,
- wherein the electrically insulating film comprises an angular U-shaped region, wherein a first surface for insulating the first expansion card and a second surface protrude from a base surface of the U-shaped region, and wherein the width of the base surface corresponds to a distance of the first port to the second port of the riser card and wherein the second surface can be latched with a protrusion of one of the two ports of the riser card.

14. Rack server system according to claim 13,
wherein a main board with a plug-in slot for a riser card is arranged in the rack server system which comprises a recess next to the plug-in slot, and wherein the riser card of the assembly is plugged into the plug-in slot, so that the first expansion card is arranged in the region of the recess.

* * * * *